United States Patent
Weng et al.

(10) Patent No.: US 8,957,797 B2
(45) Date of Patent: Feb. 17, 2015

(54) ANALOG-TO-DIGITAL CONVERTING CIRCUIT WITH TEMPERATURE SENSING AND ELECTRONIC DEVICE THEREOF

(71) Applicants: Sitronix Technology Corp., Hsinchu County (TW); National Taiwan University, Taipei (TW)

(72) Inventors: Chan-Hsiang Weng, Hsinchu County (TW); Chun-Kuan Wu, Hsinchu County (TW); Tsung-Hsien Lin, Hsinchu County (TW)

(73) Assignees: Sitronix Technology Corp., Hsinchu County (TW); National Taiwan University, Taipei (TW)

( * ) Notice: Subject to any disclaimer, the term of this patent is extended or adjusted under 35 U.S.C. 154(b) by 0 days.

(21) Appl. No.: 13/919,112

(22) Filed: Jun. 17, 2013

(65) Prior Publication Data

US 2014/0347198 A1    Nov. 27, 2014

(30) Foreign Application Priority Data

May 24, 2013    (TW) .............................. 102118329 A (51) Int. Cl.
*H03M 1/06*    (2006.01)
*H03M 1/00*    (2006.01)

(52) U.S. Cl.
CPC ................ *H03M 1/06* (2013.01); *H03M 1/002* (2013.01)
USPC .......................................... 341/119; 341/155

(58) Field of Classification Search
CPC ....... H03M 1/06; H03M 1/0604; H03M 1/08; H03M 1/089

USPC .................. 341/119, 120, 155, 144, 118, 172
See application file for complete search history.

(56) References Cited

U.S. PATENT DOCUMENTS

| | | | |
|---|---|---|---|
| 5,227,795 A | 7/1993 | Yamakido et al. | |
| 6,799,889 B2 * | 10/2004 | Pennock | 374/178 |
| 7,459,955 B2 * | 12/2008 | Willis | 327/512 |

(Continued)

FOREIGN PATENT DOCUMENTS

| | | | |
|---|---|---|---|
| JP | S61-117425 A | 6/1986 | |
| JP | S61-29652 B2 | 7/1986 | |

(Continued)

OTHER PUBLICATIONS

Communication from the Japanese Patent Offive Regarding a Counterpart Foreign Application Dated (Emporer Year 26) Sep. 1, 2014.

(Continued)

*Primary Examiner* — Peguy Jean Pierre
(74) *Attorney, Agent, or Firm* — Rosenberg, Klein & Lee (57) ABSTRACT

The present invention relates to an analog-to-digital converting circuit with temperature sensing and the electronic device thereof. The present invention uses a first impedance device to receive a reference voltage and produces an input current according to a temperature. An analog-to-digital converting unit is coupled to the first impedance device and produces a digital output signal according to the input current. Thereby, according to the present invention, by integrating the first impedance device into the analog-to-digital converting circuit, the circuit area and the power consumption can be lowered, which further reduces the cost and improves the accuracy of temperature sensing.

17 Claims, 10 Drawing Sheets

(56) References Cited

U.S. PATENT DOCUMENTS

| | | | |
|---|---|---|---|
| 7,511,990 B2* | 3/2009 | Chung et al. | 365/158 |
| 7,804,335 B2* | 9/2010 | Nito | 327/83 |
| 7,843,231 B2* | 11/2010 | Arguello | 327/63 |
| 8,183,910 B2* | 5/2012 | Chung et al. | 327/512 |
| 8,274,421 B2* | 9/2012 | Rey-Losada | 341/163 |
| 8,373,946 B2* | 2/2013 | Martin | 360/133 |
| 8,398,626 B2* | 3/2013 | Buysse et al. | 606/34 |
| 2005/0116821 A1* | 6/2005 | Wilsey et al. | 340/539.13 |
| 2008/0252674 A1* | 10/2008 | Ushinohama | 347/14 |
| 2011/0286287 A1* | 11/2011 | Kim et al. | 365/189.07 |
| 2012/0212356 A1* | 8/2012 | Killat et al. | 341/110 |

FOREIGN PATENT DOCUMENTS

| | | |
|---|---|---|
| JP | S62-267630 A | 11/1987 |
| JP | H04-906 A | 1/1992 |
| JP | H04-14801 A | 1/1992 |
| JP | 3039809 B2 | 5/2000 |
| JP | 2005-167919 A | 6/2005 |
| KR | 1998-076201 A | 11/1998 |
| KR | 10-2011-0011532 A | 2/2011 |

OTHER PUBLICATIONS

Communication from the Korean Patent Offive Regarding a Counterpart Foreign Application Dated Oct. 31, 2014.

* cited by examiner

ANALOG-TO-DIGITAL CONVERTING CIRCUIT WITH TEMPERATURE SENSING AND ELECTRONIC DEVICE THEREOF

FIELD OF THE INVENTION

The present invention relates generally to an analog-to-digital converting circuit and the electronic device thereof, and particularly to an analog-to-digital converting circuit with temperature sensing and the electronic device thereof.

BACKGROUND OF THE INVENTION

Most of modern electronic products or devices are very sensitive to the variations of operating temperatures. For example, the output performance of digital cameras will be influenced by the ambient temperature they are situated. For the inside of a chip IC, the variation of temperatures also influences the operating point and the operating speed. Thereby, in order of stable performance, most electronic devices usually need to have temperature sensors for detecting ambient temperature and compensating signals.

Currently, bipolar junction transistor (BJT) circuits are widely applied to temperature detecting circuits. The principle is to compare two voltage values both generated by BJTs. One voltage value is relevant to temperature; the other is irrelevant to temperature. Comparing the two voltage values gives the result due to temperature variation. By inputting the difference between these two voltage values, the digital code representative of temperature information can be given.

Nonetheless, the temperature sensor implemented by BJTs has lower sensitivity; it requires auxiliary circuits with higher accuracy, which results in increase in the complexity as well as costs of circuits. In addition, because BJTs are used, it is relatively difficult to operate at lower voltages. Consequently, the power consumption is increased.

Accordingly, the present invention provides a novel analog-to-digital converting circuit with temperature sensing and the electronic device thereof for solving the problems described above. Because the adoption of the auxiliary circuits with higher accuracy is avoided, the costs can be reduced. Besides, the power consumption is lowered and the resolution is enhanced. The problems described above are thus solved.

SUMMARY

An objective of the present invention is to provide an analog-to-digital converting circuit with temperature sensing and the electronic device thereof. By integrating a first impedance device into the analog-to-digital converting circuit, the circuit area and the power consumption can be lowered. Thereby, the cost is reduced and the accuracy of temperature sensing is improved.

The analog-to-digital converting circuit with temperature sensing according to the present invention comprises a first impedance device and an analog-to-digital converting unit. The first impedance device receives a first reference voltage and produces a current according to a temperature. The analog-to-digital converting unit is coupled to the first impedance device and produces a digital output signal according to the current. Thereby, according to the present invention, by integrating the first impedance device into the analog-to-digital converting circuit, the circuit area and the power consumption can be lowered. In addition, the cost is reduced and the accuracy of temperature sensing is improved.

The electronic device according to the present invention comprises a first impedance device, an analog-to-digital converting unit, and a processing circuit. The first impedance device receives a first reference voltage and produces a current according to a temperature. The analog-to-digital converting unit is coupled to the first impedance device and produces a digital output signal according to the current. The processing circuit is coupled to the analog-to-digital converting unit and produces a processing signal according to the digital output signal. Thereby, according to the present invention, by integrating the first impedance device into the analog-to-digital converting circuit, the circuit area and the power consumption can be lowered. In addition, the cost is reduced and the accuracy of temperature sensing is improved.

DETAILED DESCRIPTION

In the specifications and subsequent claims, certain words are used for representing specific devices. A person having ordinary skill in the art should know that hardware manufacturers might use different nouns to call the same device. In the specifications and subsequent claims, the differences in names are not used for distinguishing devices. Instead, the differences in functions are the guidelines for distinguishing. In the whole specifications and subsequent claims, the word "comprising" is an open language and should be explained as "comprising but not limited to". Beside, the word "couple" includes any direct and indirect electrical connection. Thereby, if the description is that a first device is coupled to a second device, it means that the first device is connected electrically to the second device directly, or the first device is connected electrically to the second device via other device or connecting means indirectly.

In order to make the structure and characteristics as well as the effectiveness of the present invention to be further understood and recognized, the detailed description of the present invention is provided as follows along with embodiments and accompanying figures.

Figure 1:
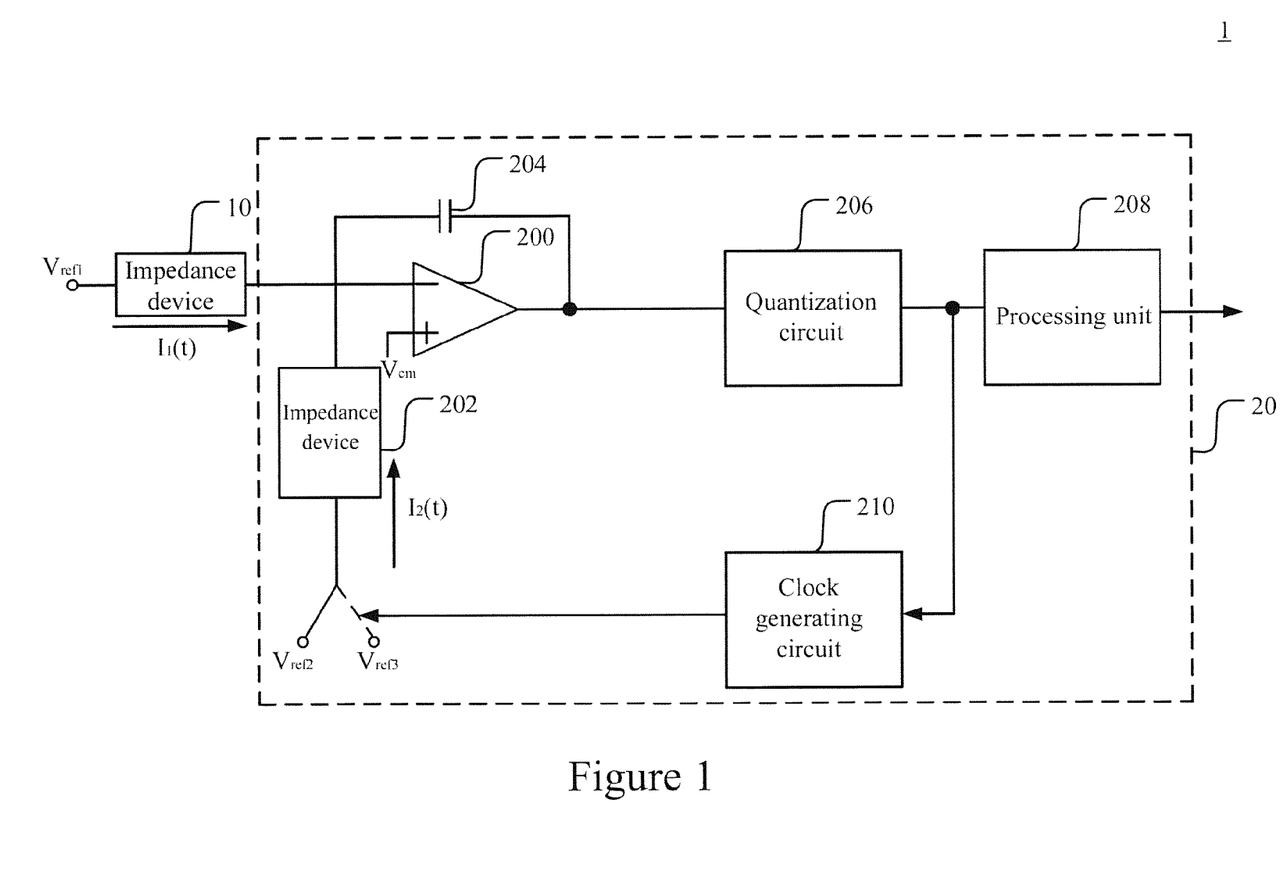
FIG. 1 shows a circuit diagram of the analog-to-digital converting circuit with temperature sensing according a first embodiment of the present invention.

FIG. 1 shows a circuit diagram of the analog-to-digital converting circuit with temperature sensing according a first embodiment of the present invention. As shown in the figure, the analog-to-digital converting circuit 1 with temperature sensing according to the present invention comprises an impedance device 10 and an analog-to-digital converting unit 20. The impedance device 10 has a first terminal and a second terminal. The first terminal of the impedance device 10 receives a reference voltage Vref1; the second terminal of the impedance device 10 is coupled to the analog-to-digital converting circuit 20. The impedance device 10 produces a current $I_1(t)$ according to the temperature. The analog-to-digital converting unit 20 is coupled to the impedance device 10 and produces a digital output signal according to the current $I_1(t)$ for acquiring the temperature information.

The analog-to-digital converting unit 20 comprises an operational amplifier unit 200, an impedance device 202, a capacitor 204, a quantization circuit 206, a processing unit 208, and a clock generating circuit 210. The operational amplifier unit 200 has an inverted input, an output, and a positive input. The inverted and positive inputs of the operational amplifier unit 200 are coupled to the impedance device 10 and a common-mode voltage Vcm, respectively. The impedance device 202 has a first terminal and a second terminal. The first terminal of the impedance device 202 is coupled to the inverted input of the operational amplifier unit 200. The second terminal of the impedance device 202 receives the reference voltage Vref2 or Vref3. The reference voltage Vref3 can be zero volt; the reference voltages Vref1 and Vref2 can be equivalent. The capacitor 204 has a first terminal and a second terminal. The first and second terminals of the capacitor 204 are coupled to the inverted input and the output of the operation amplifier unit 200, respectively.

The quantization circuit 206 is coupled to the output of the operation amplifier unit 200 for quantizing an output signal output by the operation amplifier unit 200 and producing a quantization signal. The processing unit 208 is coupled to the quantization circuit 206 and produces a digital output signal according to the quantization signal. The clock generating circuit 210 is coupled to the quantization circuit 206 and produces a clock signal according to the quantization signal for controlling the impedance device 202 to receive the reference voltage Vref2 or Vref3.

Impedance devices usually have temperature coefficients accounting for the variations of, for example, resistors or transistors. In other words, as the temperature changes, impedance devices change as well. Thereby, the first terminal of the impedance 10 is changed from receiving the input voltage to receiving the reference voltage Vref1, so that the impedance device 10 will produce different current $I_1(t)$ corresponding to the temperature variation and thus allowing the analog-to-digital converting unit 20 to acquire the temperature information according to the current $I_1(t)$. The reference voltage Vref1 can be a fixed voltage. The impedance device 10, together with the operational amplifier unit 200, the impedance device 202, and the capacitor of the analog-to-digital unit 20, are equivalent to a front-end sensing circuit. The sensing principle is described as follows.

The relation between the resistance $R_x(t)$ of a general resistance device and temperature is $R_x(t)=R_x(ty)\times(1+tc_x\times(t-ty))$, where x is the resistor type, t and ty are temperatures, $tc_x$ is the temperature coefficient as the resistor type is x, and $R_x(ty)$ is the resistance as the resistor type is x and the temperature is ty. In the following, the temperature ty being zero degree is used as an example of baseline temperature. When the reference voltages Vref1, Vref2 are both Vref and the second terminal of the impedance device 202 receives the reference voltage Vref2, the current $I_1(t)$ produced by the impedance device 10 of resistor type x being 1 is:

$$I_1(t)=(V_{ref}-V_{cm})/(R_1(0)\times(1+tc_1\times t)) \qquad (1)$$

Likewise, the current $I_2(t)$ produced by the impedance device 202 of resistor type x being 2 is:

$$I_2(t)=(V_{ref}-V_{cm})/(R_2(0)\times(1+tc_2\times t)) \qquad (2)$$

According to the above description, assume that the impedance devices 10, 202 have positive temperature coefficients. Namely, the temperature coefficients $tc_1$ and $tc_2$ are greater than zero. As the temperature rises, the respective resistance values $R_1(t)$ and $R_2(t)$ of the impedance devices 10, 202 increase and the currents $I_1(t)$ and $I_2(t)$ flowing in decrease. Because the currents $I_1(t)$ and $I_2(t)$ flowing into the input of the operational amplifier unit 200 decrease, the digital output signal resolved by the analog-to-digital converting unit 20 is consequently smaller. On the contrary, as the temperature lowers, the resistance values $R_1(t)$ and $R_2(t)$ both decrease and the currents $I_1(t)$ and $I_2(t)$ flowing in increase, making the digital output signal resolved by the analog-to-digital converting unit 20 greater. Accordingly, the impedance device 10 changes the impedance value according to the temperature variation and thus acquiring the present temperature condition.

Moreover, the analog-to-digital converting unit 20 according to the present invention is a continuous-time delta-sigma modulator (CTDSM). According to the present invention, the impedance device 10 is integrated into the analog-to-digital converting unit 20 for sensing the temperature condition. Thereby, by integrating the impedance device 10 into the analog-to-digital converting circuit 1, the circuit area and the power consumption are lowered, and hence reducing the cost.

Figure 2:
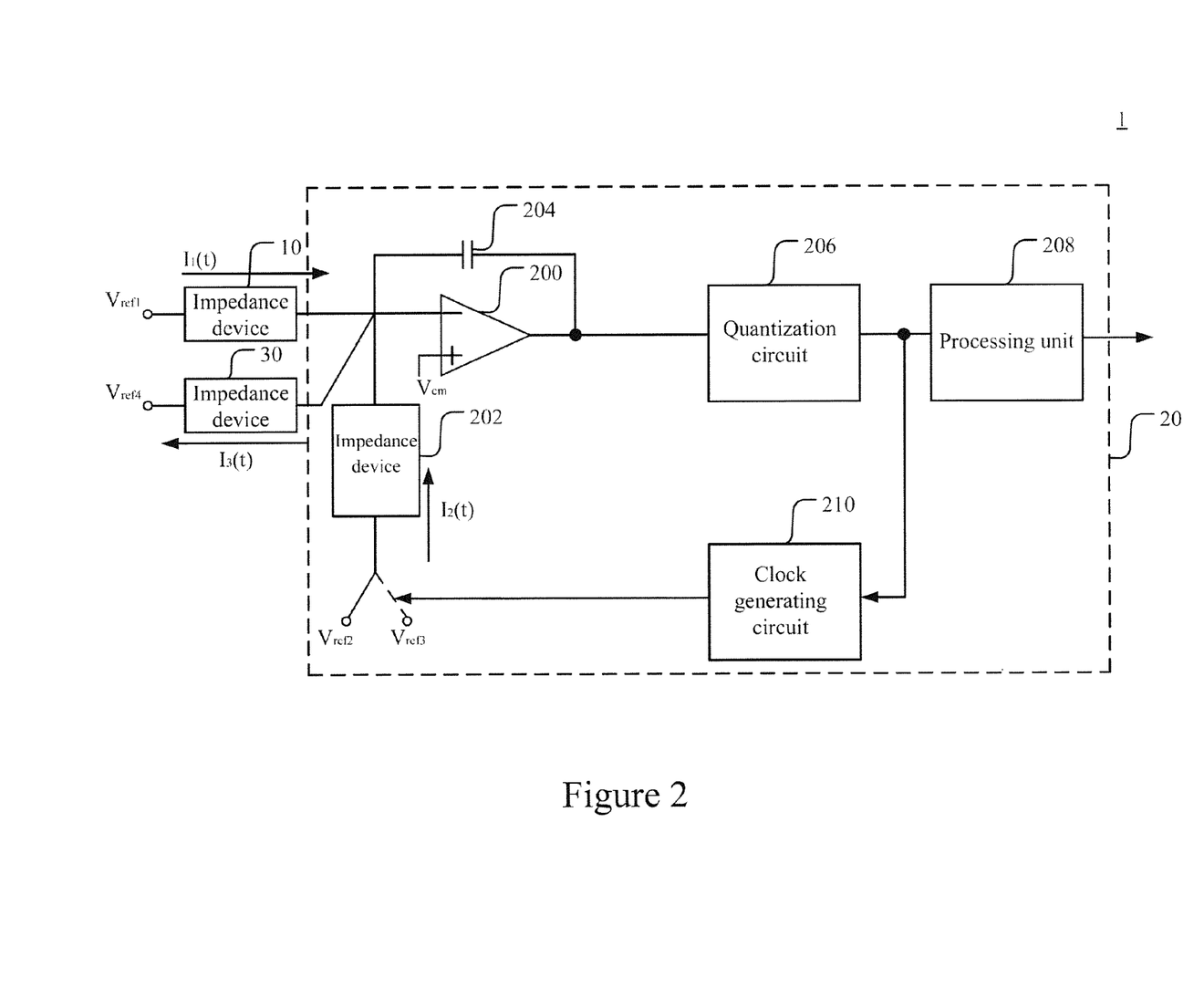
FIG. 2 shows a circuit diagram of the analog-to-digital converting circuit with temperature sensing according a second embodiment of the present invention.

FIG. 2 shows a circuit diagram of the analog-to-digital converting circuit with temperature sensing according a second embodiment of the present invention. As shown in the figure, the difference between the present embodiment and the first one is that the analog-to-digital converting circuit 1 with temperature sensing according to the present embodiment further comprises an impedance device 30 having a first terminal and a second terminal. The first terminal of the impedance device 30 is coupled to the inverted input of the operational amplify unit 200; the second terminal of the impedance device 30 receives the reference voltage Vref4, which can be zero volt.

According to the first embodiment, the temperature coefficients $tc_1$ and $tc_2$ are usually much smaller than 1. Hence, as the temperature changes, the changes in the resistance values $R_1(t)$ and $R_2(t)$ are not significant. For increasing sensitivity of the front end of temperature sensing, namely, the impedance devices 10, 202, the impedance device 30 is added according to the present embodiment. The value or the property of the temperature coefficient $tc_3$ of the impedance device 30 is different from the value or the property of the temperature coefficient $tc_1$. For example, when the temperature coefficient $tc_1$ is a positive temperature coefficient, the temperature coefficient $tc_3$ is a negative temperature coefficient. Alternatively, when the temperature coefficient $tc_1$ is a negative temperature coefficient, the temperature coefficient $tc_3$ is a positive temperature coefficient. According to the present embodiment, the temperature coefficient $tc_1$ is a positive temperature coefficient, and the temperature coefficient $tc_3$ is a negative temperature coefficient. The, as the temperature increases, the resistance value $R_1(t)$ increases accordingly, and the resistance value $R_3(t)$ of the impedance device 30 decreases accordingly.

Please refer to FIG. 2. When the temperature ty is the baseline temperature, namely, zero degree, the reference voltages Vref1, Vref2 are both Vref, the second terminal of the impedance device 202 receives the reference voltage Vref2, and Vref4 is zero, it is found that the current $I_3(t)$ flowing out of the resistance value $R_3(t)$ is:

$$I_3(t)=(V_{cm}-0)/(R_3(0)\times(1+tc_3\times t)) \tag{3}$$

If the temperature rises, the resistance values $R_1(t)$ and $R_2(t)$ increase, making the currents $I_1(t)$ and $I_2(t)$ smaller. Besides, the resistance value $R_3(t)$ decreases and making the output current $I_3(t)$ greater. Thereby, the difference in current values becomes greater. According to the present embodiment, the range of the variation in the input currents of the analog-to-digital converting unit 20 becomes greater as the temperature varies by using the impedance device 30 for increasing the sensitivity of temperature.

Furthermore, in addition to improving sensitivity using the concept of positive and negative currents, according to the present embodiment, the function of amplifying or reducing the currents $I_1(t)$, $I_2(t)$, and $I_3(t)$ of the analog-to-digital converting unit 20 can be achieved by modifying the resistance values of the impedance devices 10, 202, 30 as well. As shown in FIG. 2, the sizing of the plurality of impedance devices can be viewed equivalently as multiplying the resistance values $R_1(t)$, $R_2(t)$, and $R_3(t)$ by a multiple a. In other words, the resistance values of the impedance devices 10, 202, 30 are a $R_1(t)$, a $R_2(t)$, and a $R_3(t)$, respectively. Thereby, according to the present embodiment, the currents $I_1(t)$, $I_2(t)$, and $I_3(t)$ can be amplified or reduced equivalently by sizing using the multiple a without extra hardware circuits. Thus, the circuit area and cost can be saved.

In addition, if the analog-to-digital converting unit 20 according to the present invention is disposed in a chip IC, the impedance devices 10, 30 according to the present invention can also be disposed on chip or off chip. To elaborate, please refer to FIG. 1 and FIG. 2. In other embodiments, the impedance devices 10, 202 can be selected from the group consisting of resistors, capacitors, or inductors. For example, the impedance devices 10, 202 are both composed of a capacitor and an inductor, respectively. Alternatively, the impedance device 10 is composed of a capacitor and a resistor connected in parallel; and the impedance device 202 is composed of a capacitor and an inductor connected in series.

Figure 3:
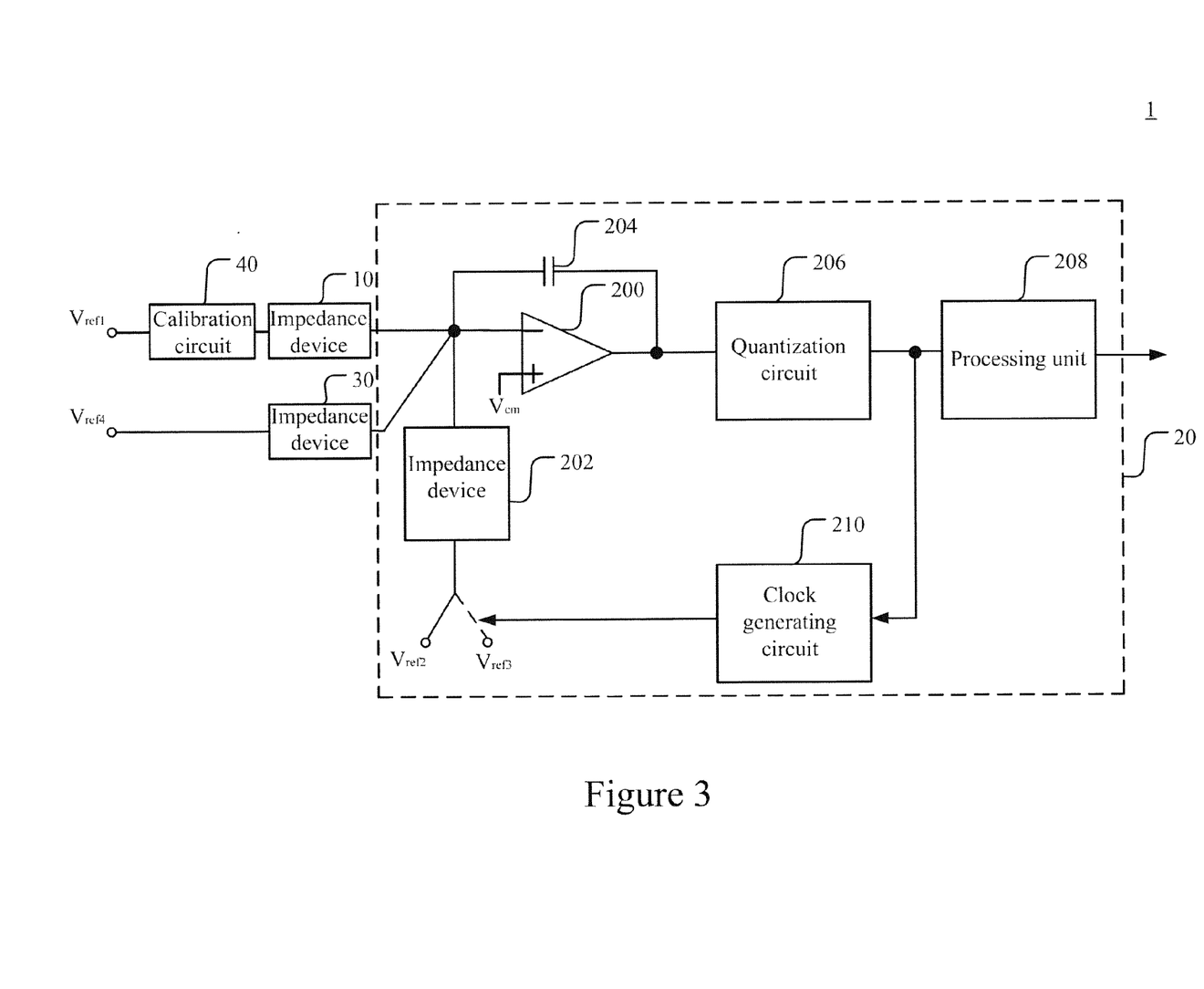
FIG. 3 shows a circuit diagram of the analog-to-digital converting circuit with temperature sensing according a third embodiment of the present invention.

FIG. 3 shows a circuit diagram of the analog-to-digital converting circuit with temperature sensing according a third embodiment of the present invention. As shown in the figure, the analog-to-digital converting circuit 1 with temperature sensing according to the present embodiment further comprises a calibration circuit 40. The calibration circuit 40 is coupled to the impedance device 10 for calibrating the resistance value of the impedance device 10. Namely, the calibration circuit 40 is connected in series with the impedance device 10 and calibrates the resistance value of the impedance device 40. During the fabrication process of a chip IC, the resistance values of impedance devices of different properties, for example, the impedance devices 10, 30, are difficult to control due to process shifts. In other words, the resistance values will be different from the ideal values. Thereby, the calibration circuit 40 is required for fine-tuning. As shown in FIG. 3, if the resistance value of the impedance device 10 has errors due to process factors, the calibration circuit 40 can be used for calibrating the impedance value of the impedance device 10 and making the resistance value equal to the ideal value.

Figure 4:
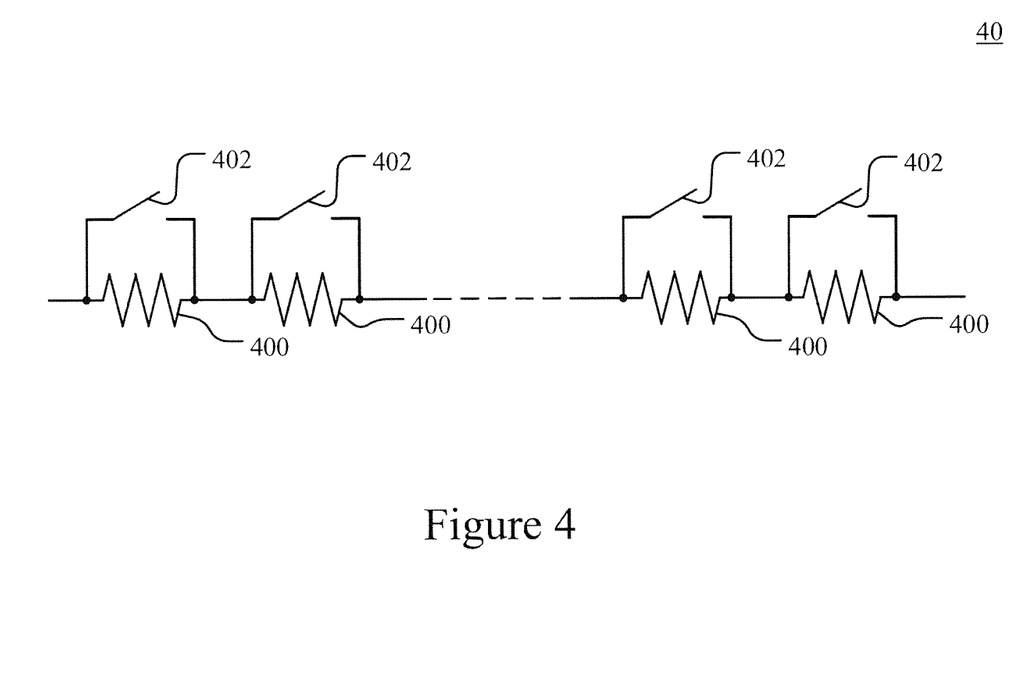
FIG. 4 shows a circuit diagram of the first calibration circuit according an embodiment of the present invention.

FIG. 4 shows a circuit diagram of the first calibration circuit according an embodiment of the present invention. As shown in the figure, the first calibration circuit 40 according to the present invention comprises at least a calibration device 400 and at least a switch 402. The calibration device 400 is coupled to the impedance device 10 for calibrating the resistance value of the impedance device 10. The switch 402 is connected in parallel with the calibration device 400 for turning on or off the calibration device 400. According to the present embodiment, the calibration circuit 40 uses a plurality of calibration devices 400 and a plurality of switches 402. The plurality of switches 402 are connected in parallel with the plurality of calibration devices 400 for turning on or off the plurality of calibration devices 400 and determining the resistance values required by the plurality of calibration devices 400 for calibrating the impedance device 10.

To elaborate, please refer to FIG. 3 and FIG. 4. In other embodiments, the impedance devices 30 and the calibration device 400 can be selected from the group consisting of resistors, capacitors, or inductors. For example, the impedance devices 30 and the calibration device 400 are both composed of a capacitor and an inductor, respectively. Alternatively, the impedance device 30 is composed of a capacitor and a resistor connected in parallel; and the calibration device 400 is composed of a capacitor and an inductor connected in series.

Figure 5:
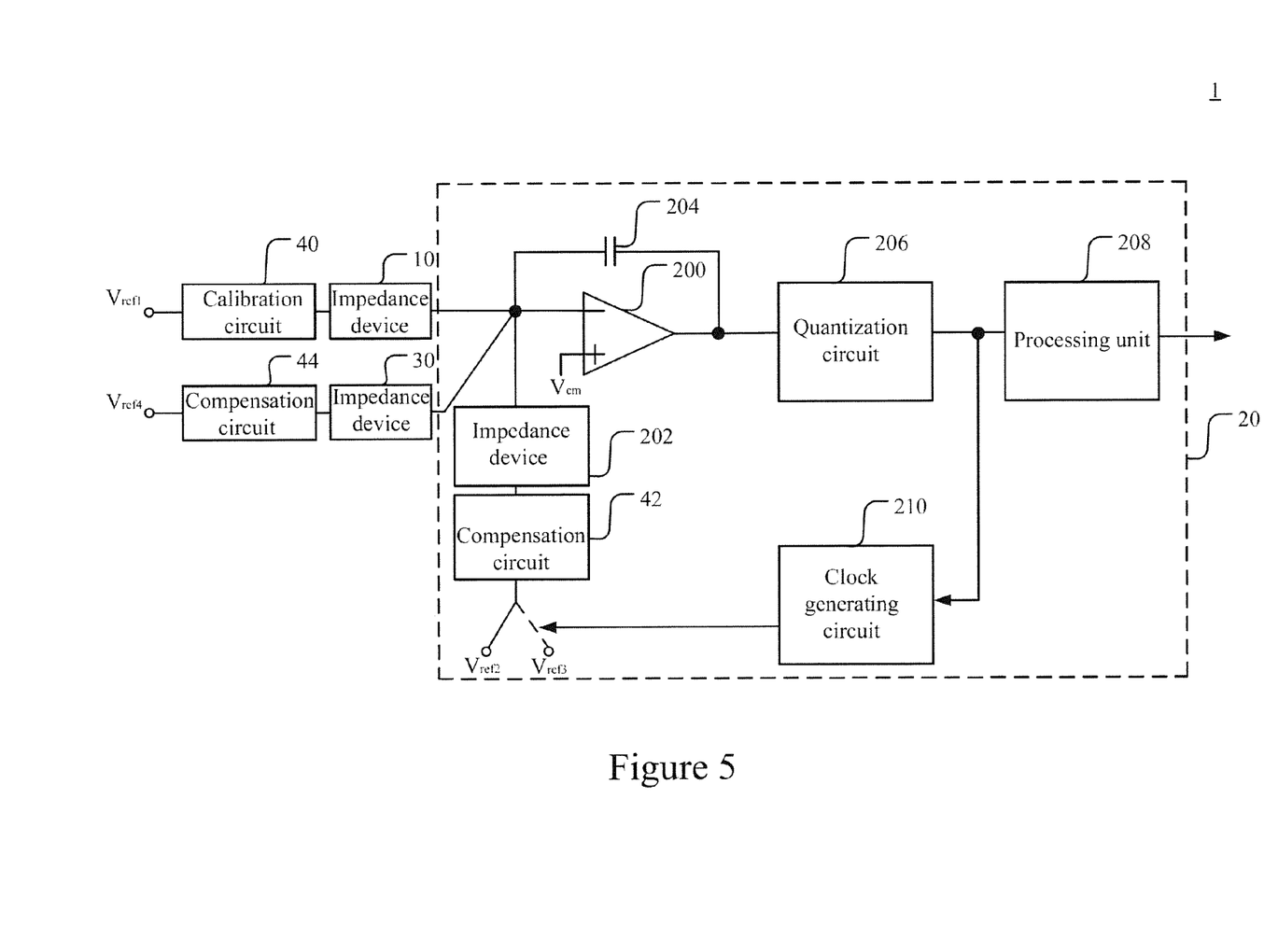
FIG. 5 shows a circuit diagram of the analog-to-digital converting circuit with temperature sensing according a fourth embodiment of the present invention.

FIG. 5 shows a circuit diagram of the analog-to-digital converting circuit with temperature sensing according a fourth embodiment of the present invention. As shown in the figure, although the deviation in resistance value due to process shift can be adjusted through the calibration circuit 40, during the adjusting process, the plurality of switches 402 will contribute extra resistance values, which are also relevant to temperature. Accordingly, for avoiding the extra resistance values contributed by the plurality of switches 402 and influencing the accuracy, the analog-to-digital converting circuit 1 with temperature sensing according to the present invention further comprises compensation circuits 42, 44. The compensation circuit 42 is coupled to the impedance device 202 and corresponding to the calibration circuit 40 for compensating the resistance value of the impedance device 202; and the compensation circuit 44 is coupled to the impedance device 30 and corresponding to the calibration circuit 40 for compensating the resistance value of the impedance device 30. In other words, because the plurality of switches 402 in the calibration circuit 40 provide extra resistance values and thus influencing the accuracy of temperature sensing, the compensation circuits 42, 44 according to the present embodiment are used for compensating the resistance values of the impedance devices 202, 30, respectively, for compensating the extra resistance values generated by the plurality of switches 402 in the calibration circuit 40. Thereby, the accuracy of temperature sensing is improved.

Figure 6:
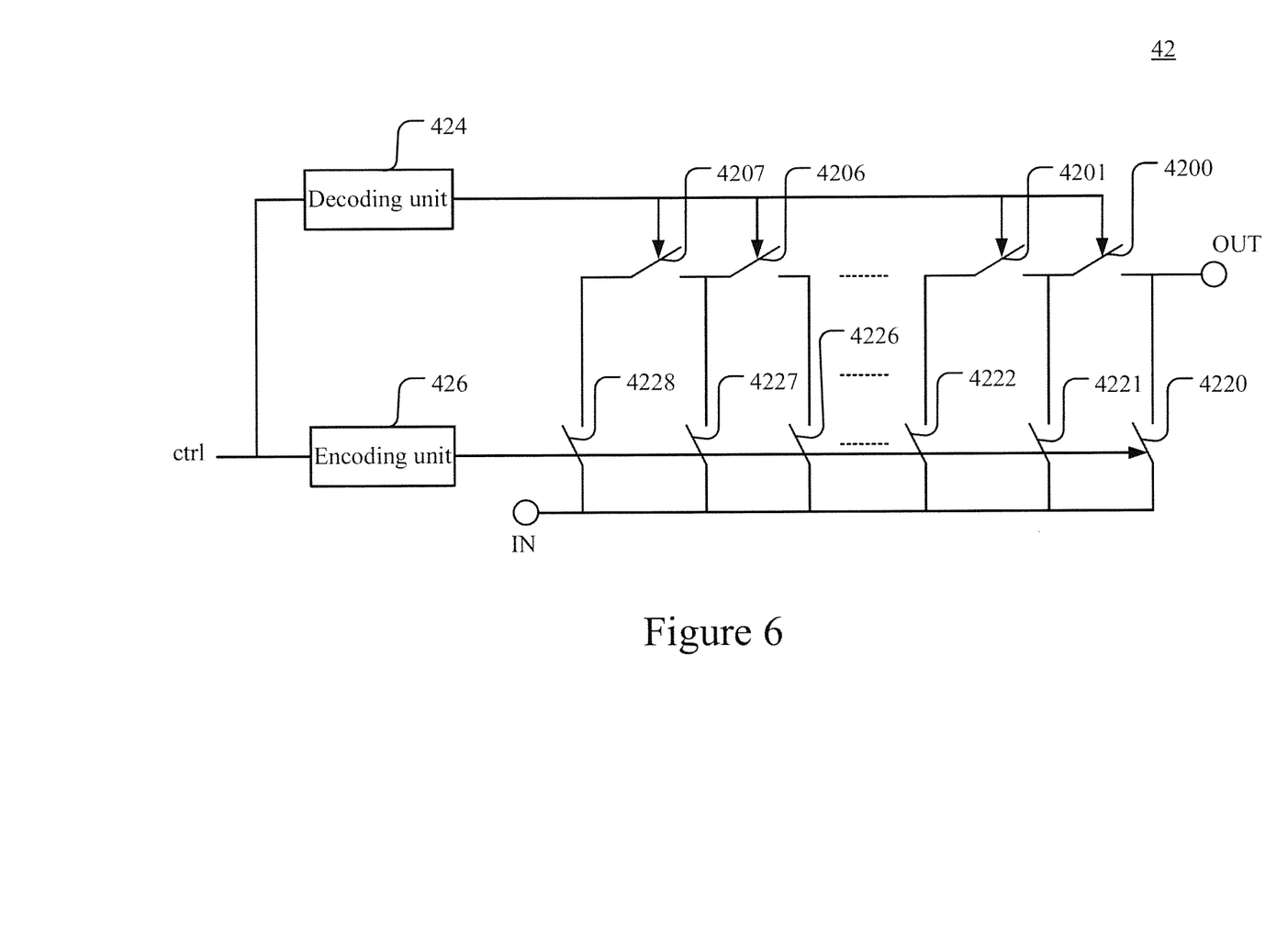
FIG. 6 shows a circuit diagram of the first compensation circuit according an embodiment of the present invention.

FIG. 6 shows a circuit diagram of the compensation circuit according an embodiment of the present invention. As shown in the figure, the compensation circuit 42 according to the present embodiment comprises a plurality of decoding switches 4200~4207, a plurality of encoding switches 4220~4228, a decoding unit 424, and an encoding unit 426. The decoding switches 4200~4207 are coupled to the impedance device 202 and are turned on or off according to the calibration circuit 40. The last-stage decoding switch 4207 of the plurality of decoding switches 4200~4207 is coupled to an output OUT of the compensation circuit 42. The plurality of encoding switches 4220~4228 have a first terminal and a second terminal, respectively. The first terminals of the plurality encoding switches 4220~4228 are all coupled to an input IN of the compensation circuit 42; the second terminals of the plurality encoding switches 4220~4228 are all coupled to the plurality of decoding switches 4200~4207, making the plurality of decoding switches 4200~4207 located between the second terminals of the plurality of encoding switches 4220~4228. The decoding unit 424 receives the control signal ctrl and produces a decoding signal according to the control signal ctrl; the decoding unit 424 then transmits the decoding signal to the plurality of decoding switches 4200~4207 for controlling their turning on or off. The encoding unit 426 is coupled to the plurality of encoding switches 4220~4228. The encoding unit 426 receives the control signal ctrl and produces an encoding signal according to the control signal ctrl; the encoding unit 426 then transmits the encoding signal to the plurality of encoding switches 4220~4228 for controlling their turning on or off.

Based on the above description, the decoding unit 424 and the encoding unit 426 know how many decoding switches 4200~4207 need to be turned on according to the control signal ctrl and hence compensate the impedance values of the plurality of switches 402 in the calibration circuit 40. For example, as the control signal is 01000001, then there are only two switches 402 in the calibration circuit 40 turned on. Thereby, the decoding unit 424 of the compensation circuit 42 produces the decoding signal as 00000011 for turning on the first two switches 4200, 4201 at the output OUT. Meanwhile, the encoding signal produced by the encoding unit 426 is 00000100, which is transmitted to the control terminals of the plurality of encoding switches 4220~4228 and turning on the encoding switch 4222, which allow the current to flow via the input IN, the encoding switch 4222, the decoding switches 4201, 4200, and to the output OUT. Accordingly, by turning on the decoding switches 4201, 4200, the compensation circuit 42 can compensate the impedance values of the two turned-on switches 402 in the calibration circuit 40.

Moreover, no matter how many of the plurality of decoding switches 4200~4207 are turned on, one of the plurality of encoding switches 4220~4228 will be turned on. For example, when the decoding signal produced by the decoding unit 424 is 00000000, namely, when the plurality of decoding switches 4200~4207 are all turned off, the encoding signal produced by the encoding unit 426 is 000000001 for controlling the encoding switch 4220 to turn on and allowing the current to flow via the input IN and the encoding switch 4220 to the output OUT; when the decoding signal produced by the decoding unit 424 is 11111111, namely, when the plurality of decoding switches 4200~4207 are all turned on, the encoding signal produced by the encoding unit 426 is 100000000 for controlling the encoding switch 4228 to turn on and allowing the current to flow via the encoding switch 4228 and the plurality of decoding switches 4207~4200 to the output OUT. Thereby, no matter how many of the plurality of decoding switches 4200~4207 are turned on, one of the plurality of encoding switches 4220~4228 will be turned on. Consequently, the number of turned-on switches in the compensation circuit 42 will be always more than the number of the turned-on switches in the calibration circuit 40 by one; the error is thus produced. Accordingly, according to the present invention, a permanently turned-on switch is disposed in the calibration circuit 40 and the problem described above can be solved.

Figure 7:
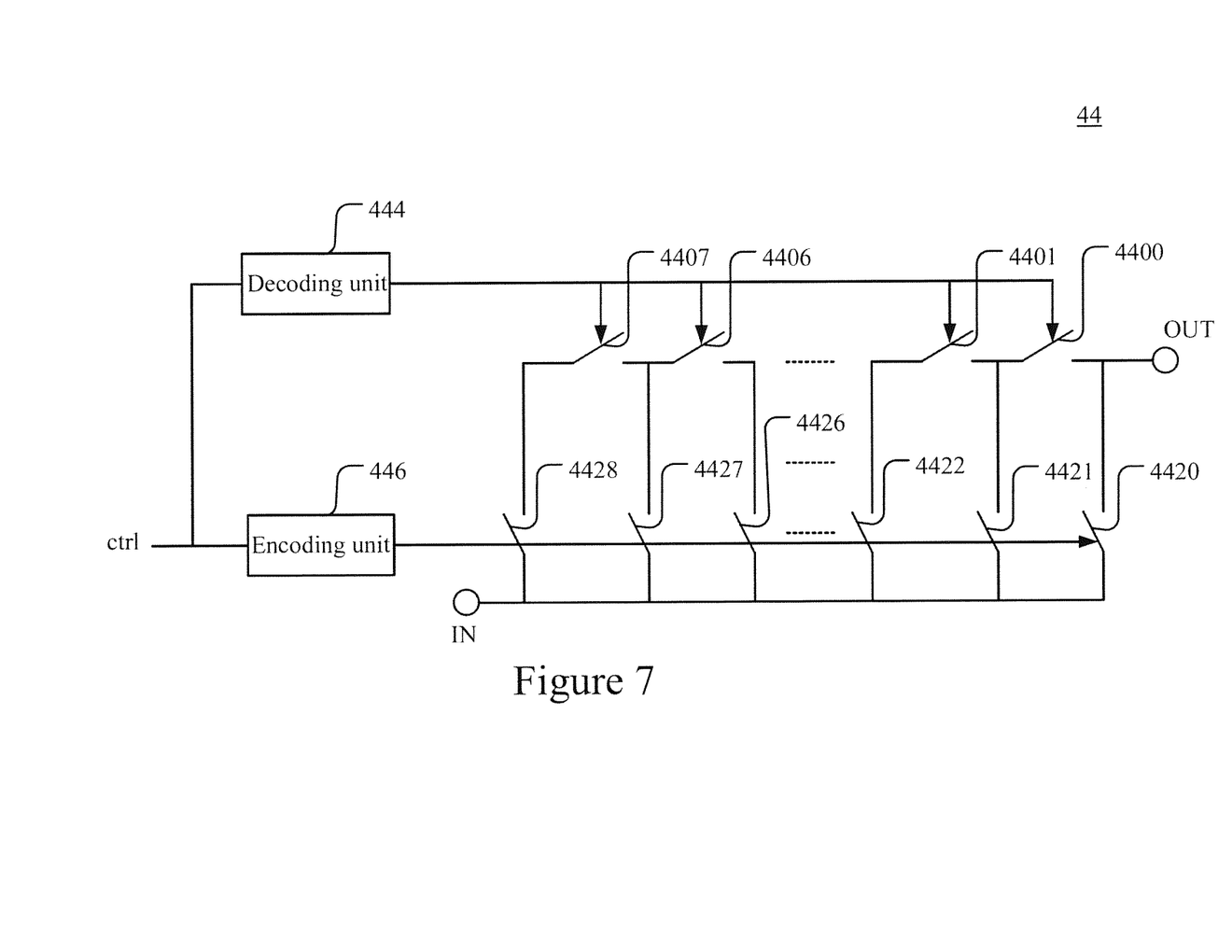
FIG. 7 shows a circuit diagram of the second compensation circuit according an embodiment of the present invention.

Likewise, FIG. 7 shows a circuit diagram of another compensation circuit according an embodiment of the present invention. As shown in the figure, the compensation circuit 44 according to the present embodiment comprises a decoding unit 444, an encoding unit 446, a plurality of decoding switches 4400~4407, and a plurality of encoding switches 4420~4428. The circuit devices of the decoding unit 444, the encoding unit 446, the plurality of decoding switches 4400~4407, and the plurality of encoding switches 4420~4428 in the compensation circuit 44 according to the present embodiment are all identical to the ones in the compensation circuit 42 in FIG. 6. In addition, the operating principle of the compensation circuit 44 according to the present embodiment is identical to that of the compensation circuit 42 in FIG. 6. Hence, the details will not be described again.

Figure 8:
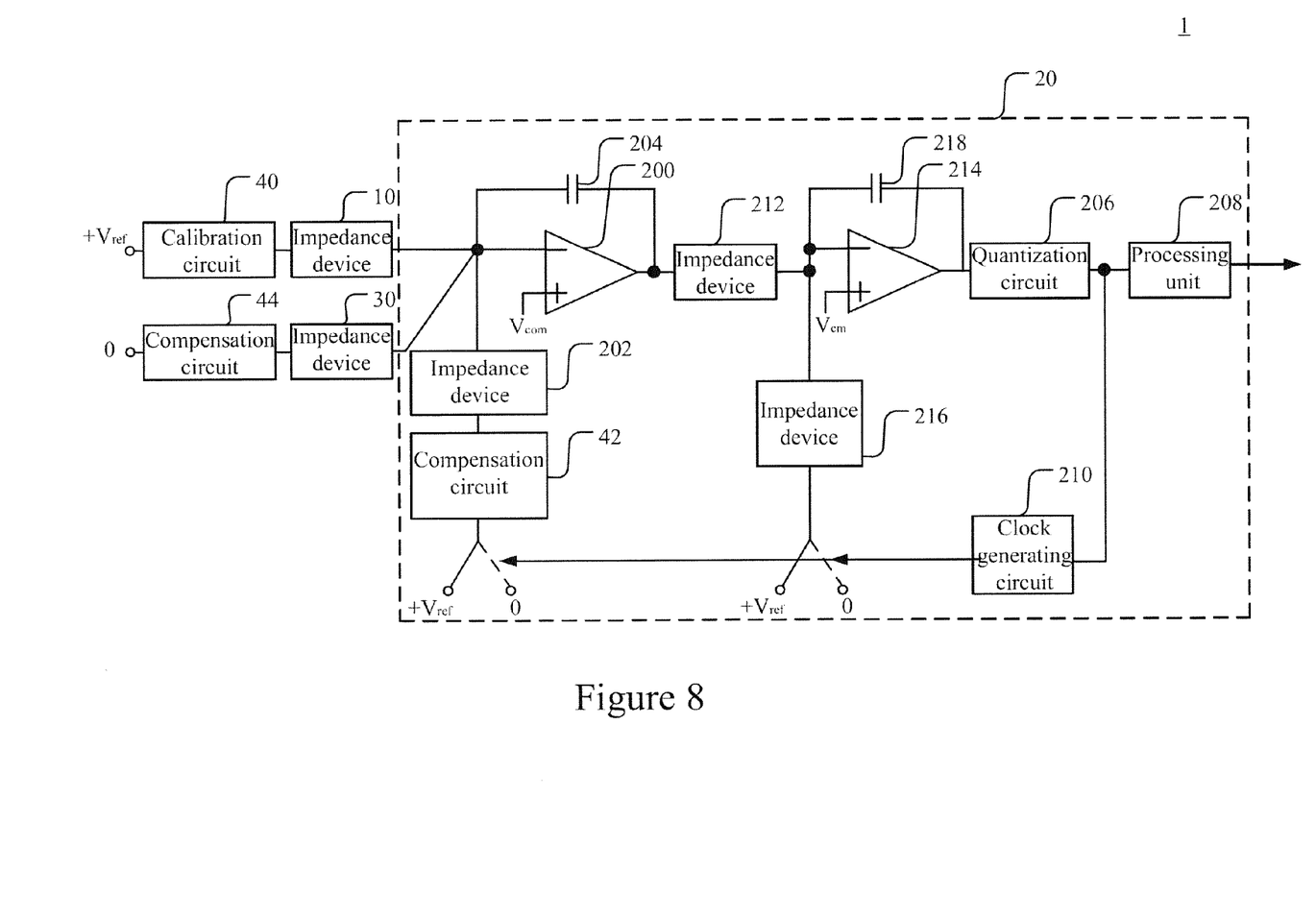
FIG. 8 shows a circuit diagram of the analog-to-digital converting circuit with temperature sensing according a fifth embodiment of the present invention.

FIG. 8 shows a circuit diagram of the analog-to-digital converting circuit with temperature sensing according a fifth embodiment of the present invention. As shown in the figure, the analog-to-digital converting circuit 1 with temperature sensing according to the present embodiment further comprises an impedance device 212, an operational amplifier unit 214, an impedance device 216, and a capacitor 218. The impedance device 212 is coupled to the output of the first operational amplifier unit 200. The operational amplifier unit 214 has an inverted input, an output, and a positive input. The inverted and positive inputs of the operational amplifier unit 214 are coupled to the impedance device 212 and a common-mode voltage Vcm, respectively. The impedance device 216 has a first terminal and a second terminal. The first terminal of the impedance device 216 is coupled to the inverted input of the operational amplifier unit 214 and the impedance device 212; the second terminal of the impedance device 216 receives the reference voltage Vref5 or Vref6. The reference voltage Vref5 can adopt the voltage Vref essentially identical to the reference voltage Vref1 and Vref2; Vref6 can be zero volt. Like the description for FIG. 1, the clock generating circuit 210 generates the clock signal for controlling the impedance device 216 to receive the reference voltage Vref5 or Vref6. The capacitor 218 has a first terminal and a second terminal. The first terminal of the capacitor 218 is coupled to the inverted input of the operational amplifier unit 214, the impedance device 212, and the impedance device 216; the second terminal of the capacitor 218 is coupled to the output of the operational amplifier unit 214. Based on the above description, the analog-to-digital converting unit 20 according to the present embodiment is a second-order CTDSM, which can improve the performance of analog-to-digital conversion.

Figure 9:
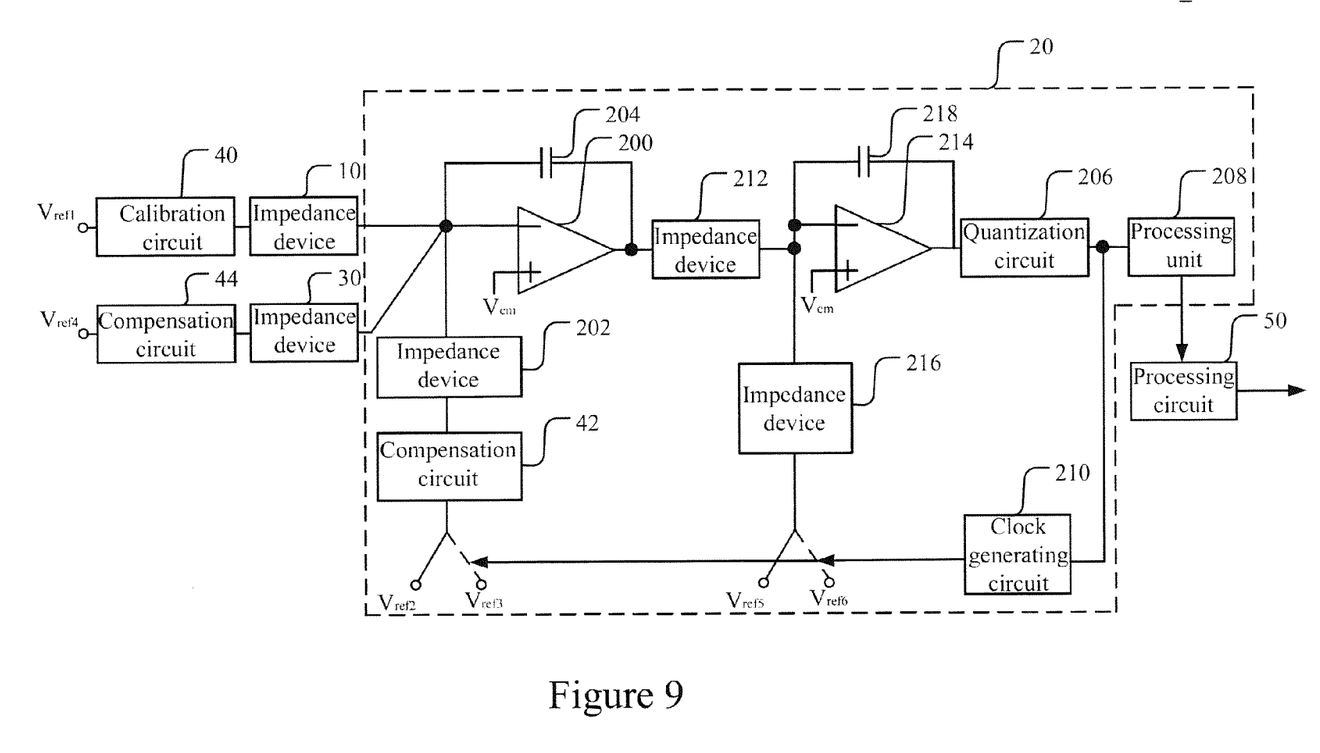
FIG. 9 shows a circuit diagram of the analog-to-digital converting circuit with temperature sensing applied to an electronic device according an embodiment of the present invention.

FIG. 9 shows a circuit diagram of the analog-to-digital converting circuit with temperature sensing applied to an electronic device according an embodiment of the present invention. As shown in the figure, the difference between the present embodiment and the previous one is that the analog-to-digital converting circuit with temperature sensing according to the present embodiment can be applied to any electronic device requiring temperature information signal. The electronic device 5 according to the present embodiment comprises the impedance device 10, the analog-to-digital converting unit 20, and a processing circuit 50. The impedance device 10 receives the reference voltage Vref1 and produces the current $I_1(t)$ according to the temperature. The analog-to-digital converting unit 20 is coupled to the impedance device 10 and produces the digital output signal according to the input current $I_1(t)$. The processing circuit 50 is coupled to the analog-to-digital converting unit 20, and produces a processing signal according to the digital output signal and outputs the processing signal for the use of subsequent circuits. The processing circuit 50 is a gas sensor, a photo sensor, a pressure sensor, or a gravity sensor.

To elaborate, please refer to FIG. 8 and FIG. 9. In other embodiments, the impedance devices 212, 216 can be selected from the group consisting of resistors, capacitors, or inductors. For example, the impedance devices 212, 216 are both composed of a capacitor and an inductor, respectively. Alternatively, the impedance device 212 is composed of a capacitor and a resistor connected in parallel; and the impedance device 216 is composed of a capacitor and an inductor connected in series.

Figure 10:
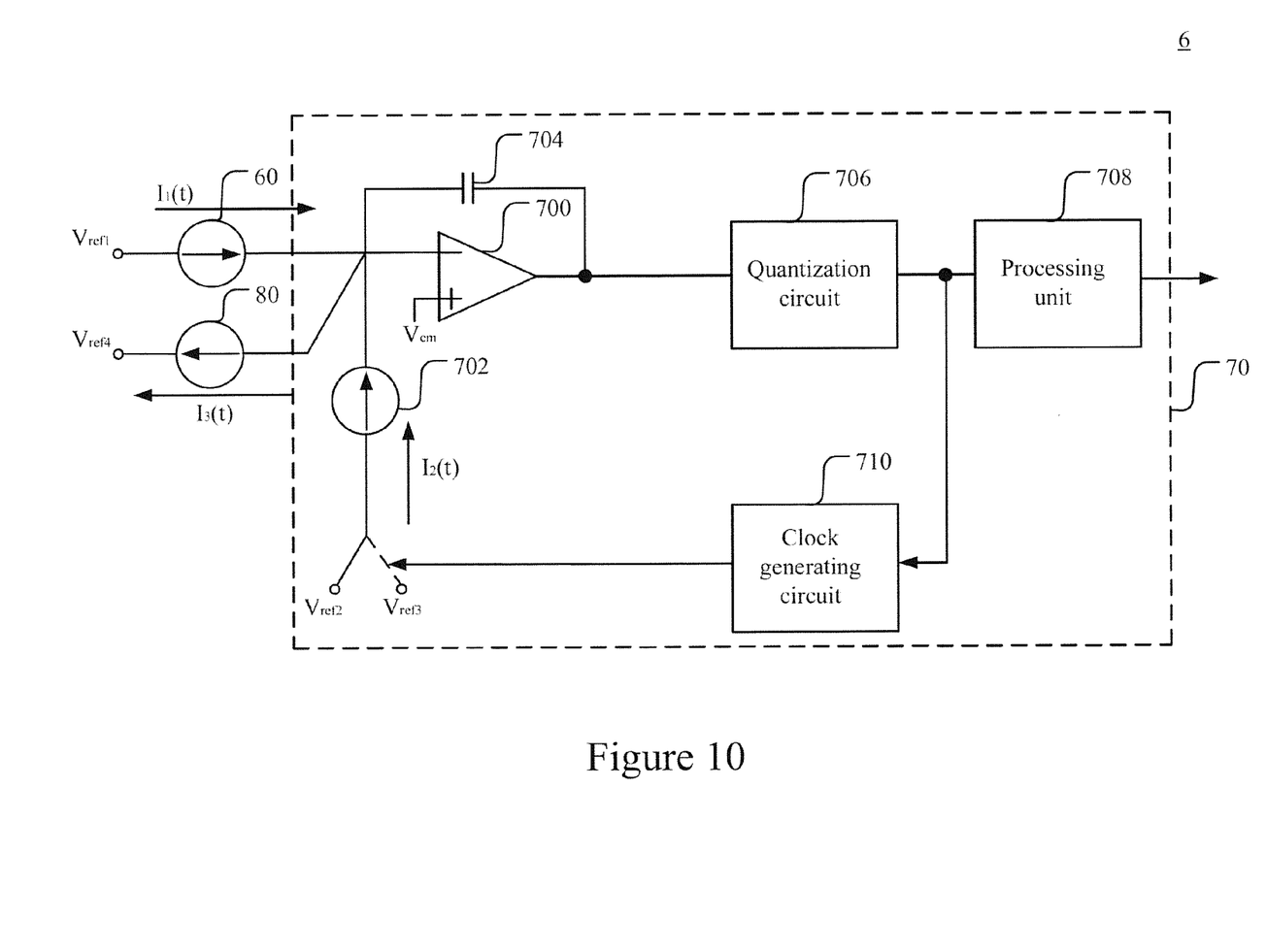
FIG. 10 shows a circuit diagram of the analog-to-digital converting circuit with temperature sensing according a fifth embodiment of the present invention.

FIG. 10 shows a circuit diagram of the analog-to-digital converting circuit with temperature sensing according a fifth embodiment of the present invention. As shown in the figure, the difference between the analog-to-digital converting circuit 6 with temperature sensing according to the present embodiment and the one according to the second embodiment is that the difference between the analog-to-digital converting circuit 6 with temperature sensing according to the present embodiment comprises a current source 60. The current source 60 produces the current $I_1(t)$ according to the temperature. The current $I_1(t)$ of the current source 60 flows into an analog-to-digital converting circuit 70, which then produces the digital output signal according to the current $I_1(t)$.

Furthermore, the analog-to-digital converting circuit 70 according to the present embodiment comprises an operational amplifier unit 700, a current source 702, a capacitor 704, a quantization circuit 706, a processing circuit 708, and a clock generating circuit 710. The operational amplifier unit 700 has an inverted input, an output, and a positive input. The inverted and positive inputs of the operational amplifier unit 700 are coupled to the current source 60 and the common-mode voltage Vcm, respectively. The current source 702 has a first terminal and a second terminal. The first terminal of the current source 702 is coupled to the inverted input of the operational amplifier unit 700; the second terminal of the current source 702 receives the reference voltage Vref2 or Vref3. The reference Vref3 can be zero volt; the reference voltages Vref1, Vref2 can be essentially identical. The current source 700 produces a current $I_2(t)$ flowing into the operational amplifier unit 700. The capacitor 704 has a first terminal and a second terminal coupled to the inverted input and the output of the operational amplifier unit 700, respectively. Thereby, the analog-to-digital converting circuit 70 according to the present embodiment can produce the digital output signal according to the currents $I_1(t)$ and $I_2(t)$ produced by the current source 60. The principle of how the analog-to-digital converting circuit 70 according to the present embodiment produces the digital output signal is the same as the description for the second embodiment. Hence, the details will not be described again.

Besides, the analog-to-digital converting circuit 70 according to the present embodiment further comprises a current source 80 having a first terminal and a second terminal. The first terminal of the current source 80 is coupled to the inverted input of the analog-to-digital converting unit 700; the second terminal of the current source 80 is coupled to a reference terminal for receiving the reference voltage Vref4. The current source 80 produces the current $I_3(t)$. In addition, the current source 60 has a positive temperature coefficient; the current source 80 has a negative temperature coefficient. Alternatively, the current source 60 has a negative temperature coefficient; the current source 80 has a positive temperature coefficient. According to the present embodiment, the current $I_1(t)$ produced by the current source 60 flows into the analog-to-digital converting circuit 70, while the current $I_3(t)$ produced by the current source 80 flows out of the analog-to-digital converting circuit 70. The principle of how the analog-to-digital converting circuit 70 produces the digital output signal according to the currents $I_1(t)$, $I_3(t)$ is the same as the description for the second embodiment. Hence, the details will not be described again.

To sum up, the analog-to-digital converting circuit with temperature sensing and the electronic device thereof according to the present invention use a first impedance device to receive a reference voltage and produces an input current according to a temperature. An analog-to-digital converting unit is coupled to the first impedance device and produces a digital output signal according to the input current. Thereby, according to the present invention, by integrating the first impedance device into the analog-to-digital converting circuit, the circuit area and the power consumption can be lowered, which further reduces the cost.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An analog-to-digital converting circuit with temperature sensing, comprising:
    a first impedance device, receiving a first reference voltage, and producing a current according a temperature;
    a first operational amplifier unit, having an input and an output, and said input coupled to said first impedance device;
    a second impedance device, having a first terminal and a second terminal, said first terminal of said second impedance device coupled to said input of said first operational amplifier unit, said second terminal of said second impedance device receiving a second reference voltage or a third reference voltage;
    a first capacitor, having a first terminal and a second terminal, said first terminal of said first capacitor coupled to said input of said first operational amplifier unit and said first terminal of said second impedance device, and said second terminal of said first capacitor coupled to said output of said first operational amplifier unit; and
    an analog-to-digital converting unit, coupled to said first impedance device, and producing a digital output signal according to said current.

2. The analog-to-digital converting circuit of claim 1, and further comprising:
    a quantization circuit, coupled to said output of said first operational amplifier unit for quantizing an output signal output by said first operational amplifier unit and producing a quantization signal;
    a processing unit, coupled to said quantization circuit, and producing said digital output signal according to said quantization signal; and
    a clock generating circuit, coupled to said quantization circuit, and producing a clock signal according to said quantization signal for controlling said second impedance device to receive said second reference voltage or said third reference voltage.

3. The analog-to-digital converting circuit of claim 2, wherein said first reference voltage and said second reference voltage are essentially identical, and said third reference voltage is zero volt.

4. The analog-to-digital converting circuit of claim 1, and further comprising a first calibration circuit coupled to said first impedance device for calibrating the resistance value of said first impedance device.

5. The analog-to-digital converting circuit of claim 4, wherein said first calibration circuit comprises:
at least a first calibration device, coupled to said first impedance device; and
at least a first switch, connected in parallel with said first calibration device for turning on or off said first calibration device.

6. The analog-to-digital converting circuit of claim 1, and further comprising a third impedance device, having a first terminal and a second terminal, said first terminal of said third impedance device coupled to said input of said first operational amplifier unit, and said second terminal of said third impedance device receiving a fourth reference voltage.

7. The analog-to-digital converting circuit of claim 6, wherein said first reference voltage and said second reference voltage are essentially identical, and said third reference voltage and said fourth reference voltage are zero volt.

8. The analog-to-digital converting circuit of claim 6, and further comprising:
a first calibration circuit, coupled to said first impedance device for calibrating the resistance value of said first impedance device;
a first compensation circuit, coupled to said second impedance device, and corresponding said first calibration circuit for compensating the resistance value of said second impedance device; and
a second compensation circuit, coupled to said third impedance device, and corresponding said first calibration circuit and said first compensation circuit for compensating the resistance value of said third impedance device.

9. The analog-to-digital converting circuit of claim 8, wherein said first compensation circuit comprises at least a first compensation switch, coupled to said second impedance device, and turned on or off according to said first calibration circuit.

10. The analog-to-digital converting circuit of claim 8, wherein said second compensation circuit comprises at least a second compensation switch, coupled to said third impedance device, and turned on or off according to said first calibration circuit.

11. The analog-to-digital converting circuit of claim 6, wherein said first impedance device has a positive temperature coefficient and said third impedance device has a negative temperature coefficient, or said first impedance device has a negative temperature coefficient and said third impedance device has a positive temperature coefficient.

12. The analog-to-digital converting circuit of claim 6, and further comprising:
a fourth impedance device, coupled to said output of said first operational amplifier unit;
a second operational amplifier unit, having an input and an output, and said input of said second operational amplifier unit coupled to said fourth impedance device;
a fifth impedance device, having a first terminal and a second terminal, said first terminal of said fifth impedance device coupled to said input of said second operational amplifier unit and said fourth impedance device, and said second terminal of said fifth impedance device receiving a fifth reference voltage or a sixth reference voltage; and
a second capacitor, having a first terminal and a second terminal, said first terminal of said second capacitor coupled to said input of said second operational amplifier unit, said fourth impedance device, and said fifth impedance device, and said second terminal of said second capacitor coupled to said output of said second operational amplifier unit.

13. The analog-to-digital converting circuit of claim 12, wherein said first reference voltage, said second reference voltage, and said fifth reference voltage are essentially identical, and said third reference voltage, said fourth reference voltage and said sixth reference voltage are zero volt.

14. The analog-to-digital converting circuit of claim 1, wherein said analog-to-digital converting circuit is a continuous-time delta-sigma modulator.

15. An electronic device, comprising:
a first impedance device, receiving a first reference voltage, and producing a current according a temperature;
a first operational amplifier unit, having an input and an output, and said input coupled to said first impedance device;
a second impedance device, having a first terminal and a second terminal, said first terminal of said second impedance device coupled to said input of said first operational amplifier unit, said second terminal of said second impedance device receiving a second reference voltage or a third reference voltage;
a capacitor, having a first terminal and a second terminal, said first terminal of said capacitor coupled to said input of said first operational amplifier unit and said first terminal of said second impedance device, and said second terminal of said capacitor coupled to said output of said first operational amplifier unit;
an analog-to-digital converting unit, coupled to said first impedance device, and producing a digital output signal according to said current; and
a processing circuit, coupled to said analog-to-digital converting unit, and producing a processing signal according to said digital output signal.

16. The electronic device of claim 15, wherein said analog-to-digital converting unit further comprises:
a quantization circuit, coupled to said output of said first operational amplifier unit for quantizing an output signal output by said first operational amplifier unit and producing a quantization signal;
a processing unit, coupled to said quantization circuit, and producing said digital output signal according to said quantization signal; and
a clock generating circuit, coupled to said quantization circuit, and producing a clock signal according to said quantization signal for controlling said second impedance device to receive said second reference voltage or said third reference voltage.

17. The electronic device of claim 15, wherein said processing circuit is a gas sensor, a photo sensor, a pressure sensor, or a gravity sensor.

* * * * *